(12) United States Patent
Komatsu et al.

(10) Patent No.: US 8,299,548 B2
(45) Date of Patent: Oct. 30, 2012

(54) METHOD FOR MANUFACTURING SEMICONDUCTOR DEVICE AND SEMICONDUCTOR DEVICE

(75) Inventors: Kanako Komatsu, Kanagawa-ken (JP); Tsubasa Yamada, Kanagawa-ken (JP); Jun Morioka, Kanagawa-ken (JP); Koji Kimura, Kanagawa-ken (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 39 days.

(21) Appl. No.: 13/050,813

(22) Filed: Mar. 17, 2011

(65) Prior Publication Data

US 2012/0025307 A1 Feb. 2, 2012

(30) Foreign Application Priority Data

Jul. 29, 2010 (JP) ................................. 2010-170255

(51) Int. Cl.
*H01L 29/78* (2006.01)

(52) U.S. Cl. ......... 257/409; 257/E29.258; 257/E21.427; 257/E29.012; 438/286

(58) Field of Classification Search .................. 257/409, 257/E29.258, E21.427, E29.012; 438/286, 438/FOR. 191
See application file for complete search history.

(56) References Cited

U.S. PATENT DOCUMENTS

| 5,844,275 A * | 12/1998 | Kitamura et al. ............. 257/335 |
| 7,005,339 B2 * | 2/2006 | Huang et al. .................. 438/221 |
| 2006/0261384 A1 * | 11/2006 | Rueb et al. ..................... 257/288 |
| 2008/0296636 A1 * | 12/2008 | Darwish et al. ............... 257/256 |
| 2010/0006937 A1 | 1/2010 | Lee et al. |
| 2010/0270616 A1 * | 10/2010 | Yanagi .......................... 257/343 |

FOREIGN PATENT DOCUMENTS

| JP | 2003-031804 A | 1/2003 |
| JP | 2003-037267 A | 2/2003 |
| WO | WO-99/34449 A2 | 7/1999 |

\* cited by examiner

*Primary Examiner* — George Fourson, III
(74) *Attorney, Agent, or Firm* — Patterson & Sheridan, LLP

(57) ABSTRACT

According to one embodiment, a method is disclosed for manufacturing a semiconductor device. The method can include simultaneously forming a first field insulating film and at least one second field insulating film on a front face side of a semiconductor layer. The at least one second field insulating film is separated from the first field insulating film and thinner than the first field insulating film. The method can include forming a drift region of a first conductivity type in a region of the semiconductor layer including the first field insulating film and the second field insulating film. The method can include forming a drain region of the first conductivity type in the front face of the semiconductor layer on a side of the first field insulating film. In addition, the method can include forming a source region of the first conductivity type in the front face of the semiconductor layer on a side of the second field insulating film.

17 Claims, 7 Drawing Sheets

METHOD FOR MANUFACTURING SEMICONDUCTOR DEVICE AND SEMICONDUCTOR DEVICE

CROSS-REFERENCE TO RELATED APPLICATIONS

This application is based upon and claims the benefit of priority from Japanese Patent Application No. 2010-170255, filed on Jul. 29, 2010; the entire contents of which are incorporated herein by reference.

FIELD

Embodiments described herein relate generally to a method for manufacturing a semiconductor device and a semiconductor device.

BACKGROUND

Power devices that have a double-diffused Metal-Oxide-Semiconductor (DMOS) structure, which has a high switching speed and a high conversion efficiency in the low-voltage region, can realize high breakdown voltage operations and low on-resistances and therefore are widely used as switching elements in motor drivers, power sources, etc., and as analog output elements in audio amplifiers. However, the surface area of the output element unfortunately occupies a large part of the entire chip. To solve this problem, it is necessary to reduce the on-resistance of the DMOS.

DETAILED DESCRIPTION

Figure 1:
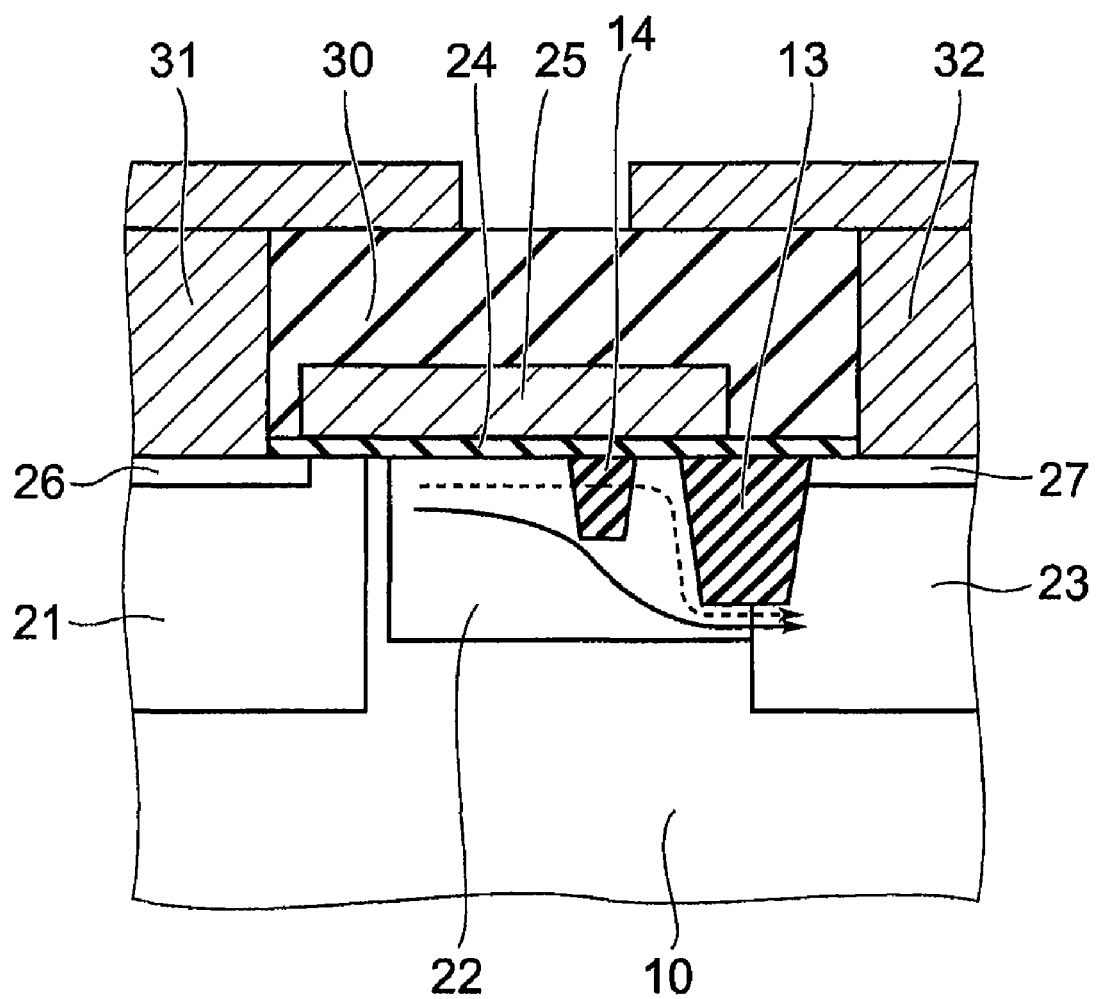
FIG. 1 is a schematic cross-sectional view of a semiconductor device of an embodiment.

According to one embodiment, a method is disclosed for manufacturing a semiconductor device. The method can include simultaneously forming a first field insulating film and at least one second field insulating film on a front face side of a semiconductor layer. The at least one second field insulating film is separated from the first field insulating film and thinner than the first field insulating film. The method can include forming a drift region of a first conductivity type in a region of the semiconductor layer including the first field insulating film and the second field insulating film. The method can include forming a gate insulating film on a front face of the semiconductor layer. The method can include forming a gate electrode on the gate insulating film. The method can include forming a drain region of the first conductivity type in the front face of the semiconductor layer on a side of the first field insulating film. The drain region has a first conductivity type impurity concentration higher than a first conductivity type impurity concentration of the drift region. In addition, the method can include forming a source region of the first conductivity type in the front face of the semiconductor layer on a side of the second field insulating film.

Various embodiments will be described hereinafter with reference to the accompanying drawings. Similar components in the drawings are marked with like reference numerals. Although the first conductivity type is the n-type and the second conductivity type is the p-type in the description of the embodiments hereinbelow, the embodiments are practicable also when the first conductivity type is the p-type and the second conductivity type is the n-type.

FIG. 1 is a schematic cross-sectional view of a semiconductor device of an embodiment.

The semiconductor device of the embodiment includes a semiconductor layer (or a semiconductor substrate) 10. The semiconductor layer 10 is, for example, silicon; and at least the front face thereof is the p-type. The semiconductor layer 10 and the semiconductor regions described hereinbelow are not limited to silicon and may be, for example, silicon carbide, gallium nitride, etc.

An n-type source region 26, a p-type channel region 21, an n-type drift region 22, an n-type drain region 27, and an n-type semiconductor region 23 are formed on the front face side of the semiconductor layer 10.

The n-type impurity concentration of the drift region 22 is lower than the n-type impurity concentration of the source region 26 and the n-type impurity concentration of the drain region 27. The n-type impurity concentration of the n-type semiconductor region 23 is higher than the n-type impurity concentration of the drift region 22 and lower than the n-type impurity concentration of the drain region 27.

The channel region 21 is separated from the drift region 22. Or, the channel region 21 may be in contact with the drift region 22.

The source region 26 is formed on the front face side of the channel region 21. The channel region 21 exists between the source region 26 and the drift region 22. The source region 26 is in contact with the channel region 21.

The n-type semiconductor region 23 is in contact with the drift region 22. The drift region 22 exists between the channel region 21 and the n-type semiconductor region 23. The drain region 27 is formed on the front face side of the n-type semiconductor region 23. Accordingly, the source region 26 is separated from the drain region 27; and the channel region 21 and the drift region 22 exist between the source region 26 and the drain region 27.

A first field insulating film 13 and a second field insulating film 14 are provided mutually separated in the drift region 22. The first field insulating film 13 and the second field insulating film 14 have, for example, a Shallow Trench Isolation (STI) structure.

The first field insulating film 13 is a first insulating substance filled into a first trench. The second field insulating film 14 is a second insulating substance filled into a second trench. The first insulating substance and the second insulating substance are, for example, silicon oxide, silicon nitride, etc.

The depth of the second trench from the drift region 22 front face is shallower than the depth of the first trench from the drift region 22 front face. Accordingly, the thickness of the second field insulating film 14 in the drift region 22 is thinner than the thickness of the first field insulating film 13 in the drift region 22.

One side face of the first field insulating film 13 on the source region 26 side is in contact with the drift region 22. One other side face of the first field insulating film 13 is in contact with the drain region 27 and the n-type semiconductor region 23. The bottom portion of the first field insulating film 13 is shallower than the bottom portion of the drift region 22 and the bottom portion of the n-type semiconductor region 23. The drift region 22 and the n-type semiconductor region 23 exist under the first field insulating film 13.

The second field insulating film 14 is provided further toward the channel region 21 side than is the first field insulating film 13. The bottom portion of the second field insulating film 14 is shallower than the bottom portion of the first field insulating film 13 and the bottom portion of the drift region 22. The drift region 22 exists under the second field insulating film 14.

The thickness of the portion of the drift region 22 under the second field insulating film 14 is thicker than the thickness of the portion of the drift region 22 under the first field insulating film 13.

A source electrode 31 is provided on the source region 26; and the source electrode 31 is electrically connected with ohmic contact to the source region 26. The semiconductor layer 10 and the channel region 21 which are p-type regions also are connected to the source electrode 31 via a not-illustrated contact portion.

A drain electrode 32 is provided on the drain region 27; and the drain electrode 32 is electrically connected with ohmic contact to the drain region 27.

A gate insulating film 24 is provided on a portion of the front face excluding the contact portion between the source region 26 and the source electrode 31, and the contact portion between the drain region 27 and the drain electrode 32. In other words, the gate insulating film 24 is provided on the front face of the channel region 21 between the source region 26 and the drift region 22, on the front face of the semiconductor layer 10 between the channel region 21 and the drift region 22, on the front face of the drift region 22, on the front face of the second field insulating film 14, and on the front face of the first field insulating film 13.

A gate electrode 25 is provided on the gate insulating film 24. The gate electrode 25 is provided between the source electrode 31 and the drain electrode 32. The gate electrode 25 is covered with an inter-layer insulating film 30 and insulated from the source electrode 31 and the drain electrode 32.

The gate electrode 25 and each of the semiconductor regions are formed in planar patterns having striped configurations extending in a direction piercing, for example, the page surface in FIG. 1.

When the desired gate voltage is applied to the gate electrode 25 in a state in which a relatively high potential is applied to the drain electrode 32 and a relatively low potential is applied to the source electrode 31, an inversion layer forms on the front face side of the channel region 21 and the front face side of the semiconductor layer 10 opposing the gate electrode 25 via the gate insulating film 24; current flows between the source electrode 31 and the drain electrode 32 through the source region 26, the inversion layer, the drift region 22, the n-type semiconductor region 23, and the drain region 27; and the state is switched to the on-state. The threshold voltage is adjusted by controlling the impurity concentration of the channel region 21.

The drift region 22, which has a relatively low n-type impurity concentration, depletes when the gate is OFF to increase the breakdown voltage. The desired breakdown voltage can be realized by adjusting the n-type impurity concentration of the drift region 22 and the drift length (the lateral direction length) according to the necessary breakdown voltage.

By providing the n-type semiconductor region 23 between the drift region 22 and the drain region 27, where the n-type impurity concentration of the n-type semiconductor region 23 is between the n-type impurity concentration of the drift region 22 and the n-type impurity concentration of the drain region 27, the breakdown voltage decrease due to the impurity concentration abruptly changing from the drift region 22 to the drain region 27 can be suppressed.

In a DMOS device, high breakdown voltage operations are possible by providing a field insulating film on the drain side. However, the field insulating film obstructs the (electron) current flowing from the source side to the drain side, causes the on-resistance to increase, and causes the current capability to decrease.

In the case where there is no second field insulating film 14 in FIG. 1, the current flowing through the drift region 22 from the source side toward the drain side travels downward along the side face of the first field insulating film 13 and travels around the bottom portion of the first field insulating film 13 as illustrated by the broken-line arrow. The current flowing in the lateral direction on the front face side abruptly changes its orientation to the depth direction (the vertical direction). This lengthens the current path and leads to an increase of the on-resistance.

Because the depth of the first field insulating film 13 is designed according to the necessary breakdown voltage, the first field insulating film 13 cannot be made thin only for the purpose of reducing the on-resistance.

Conversely, in the embodiment, a relatively deep first field insulating film 13 necessary to ensure the breakdown voltage is provided on the drain side; and the second field insulating film 14 is provided between the first field insulating film 13 and the channel region 21.

The second field insulating film 14 is formed to be thinner than the first field insulating film 13. Thereby, as illustrated by the solid-line arrow in FIG. 1, the second field insulating film 14 guides the current flowing from the source side toward the portion under the first field insulating film 13. Because the orientation of the current flowing from the source changes downward at a region more proximal to the channel region 21, the current can travel under the first field insulating film 13 to the drain side while having a shorter distance traveled in the vertical direction. As a result, the on-resistance can be reduced and the current capability can be increased without increasing the element size.

Figure 7:
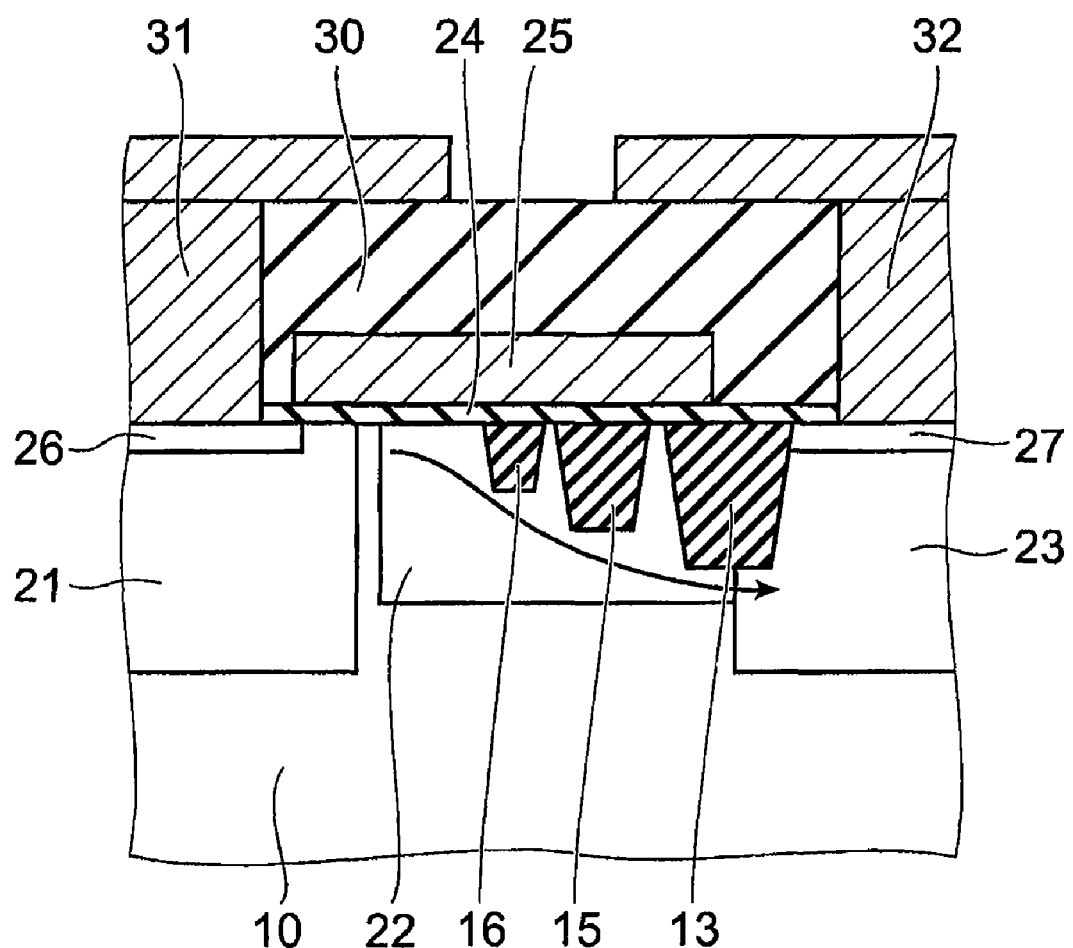
FIG. 7 is a schematic cross-sectional view of a semiconductor device of another embodiment.

The second field insulating film, which is provided further toward the channel region 21 side than is the first field insulating film 13, is not limited to one. As illustrated in FIG. 7, two second field insulating films 15 and 16 may be provided. The second field insulating films 15 and 16 also have STI structures and are insulating substances filled into trenches.

The second field insulating film 15 is separated from the first field insulating film 13 on the channel region 21 side; and the second field insulating film 16 is separated from the second field insulating film 15 on the channel region 21 side.

The second field insulating film 16, which is provided more proximal to the channel region 21 side, is thinner than the second field insulating film 15 provided between the second field insulating film 16 and the first field insulating film 13.

Thereby, as illustrated by the solid-line arrow in the embodiment as well, because the orientation of the current flowing from the source changes downward at a region more proximal to the channel region 21, the current can travel under the first field insulating film 13 to the drain side while having a shorter distance traveled in the vertical direction. As a result, the on-resistance can be reduced and the current capability can be increased without increasing the element size.

Of course, three or more second field insulating films may be provided. In the case where three or more second field insulating films are provided as well, the depths of such multiple second field insulating films are shallower than that of the first field insulating film; and the second field insulating film becomes shallower as the second field insulating film is provided toward the channel region 21 side.

A method for manufacturing the semiconductor device of the embodiment will now be described with reference to FIG. 2A to FIG. 4B.

Figure 2A:
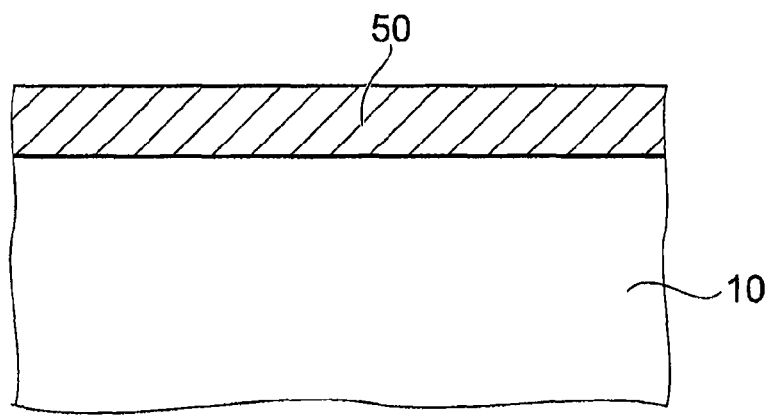
FIGS. 2A to 4B are schematic cross-sectional views illustrating a method for manufacturing the semiconductor device of the embodiment.

First, as illustrated in FIG. 2A, a resist layer 50 is formed on the front face of the semiconductor layer (or the semiconductor substrate) 10.

Figure 2B:
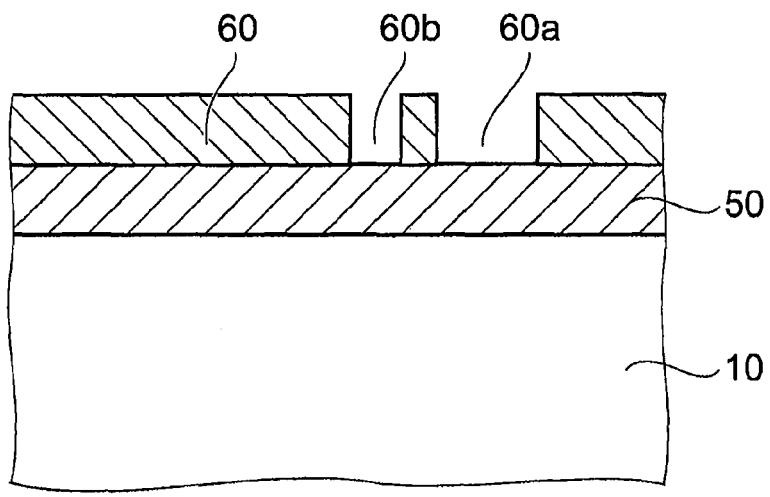
Figure 6A:
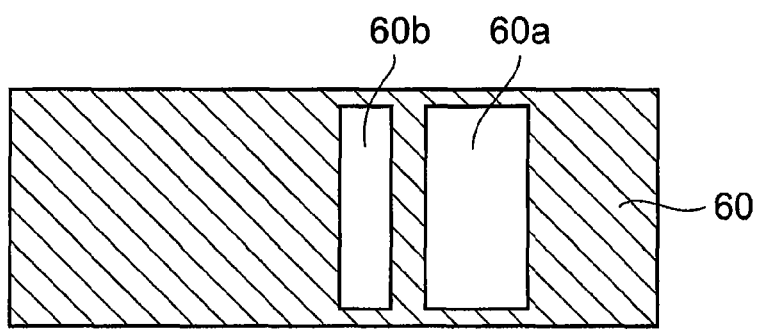
FIGS. 6A and 6B are schematic plan views of a mask.

The resist layer 50 is exposed using a mask 60 illustrated in FIG. 2B and FIG. 6A. FIG. 6A is a plan view of the mask 60.

A first transmitting portion 60a and a second transmitting portion 60b are made in the mask 60. The first transmitting portion 60a and the second transmitting portion 60b are, for example, openings. The second transmitting portion 60b has a width smaller than the width of the first transmitting portion 60a.

Exposing is performed on the portion of the resist layer 50 under the first transmitting portion 60a and the portion of the resist layer 50 under the second transmitting portion 60b. The resist layer 50 is, for example, a positive type in which the exposed portions are soluble in a developing fluid.

Figure 2C:
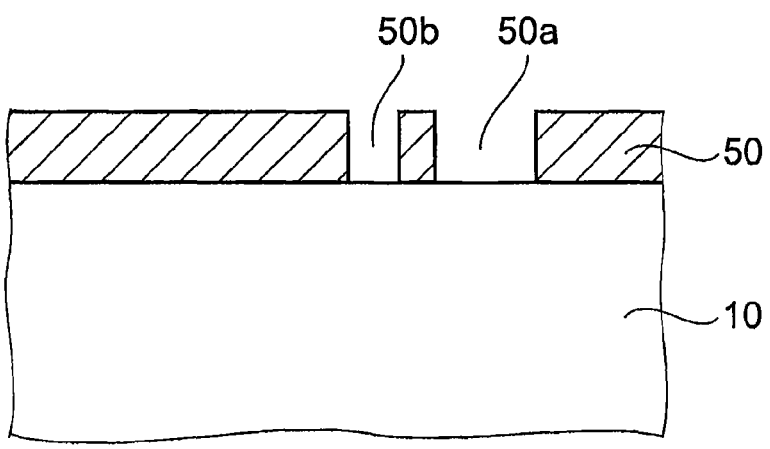

Accordingly, as illustrated in FIG. 2C, a first opening 50a and a second opening 50b are made in the resist layer 50 by developing after the exposure recited above. The width of the second opening 50b is smaller than the width of the first opening 50a.

Figure 3A:
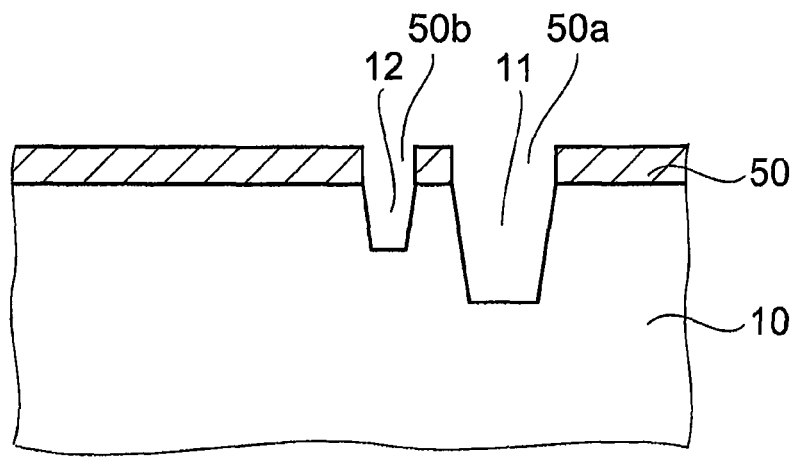

Then, the front face side of the semiconductor layer 10 is etched by, for example, Reactive Ion Etching (RIE) using the resist layer 50 as a mask. Thereby, as illustrated in FIG. 3A, a first trench 11 is made under the first opening 50a; and a second trench 12 is made under the second opening 50b.

Because the second opening 50b has an opening width smaller than that of the first opening 50a, the second trench 12 has a width smaller than that of the first trench 11. Further, due to a so-called microloading effect, ions and active species do not easily reach the bottom portion of trenches having narrow widths; and the second trench 12 is shallower than the first trench 11.

In other words, because the opening widths of the first opening 50a and the second opening 50b made in the resist layer 50 are different, the first trench 11 and the second trench 12 can be made simultaneously with mutually different widths and depths. Only one mask 60 can be used to make the two trenches 11 and 12.

Figure 3B:
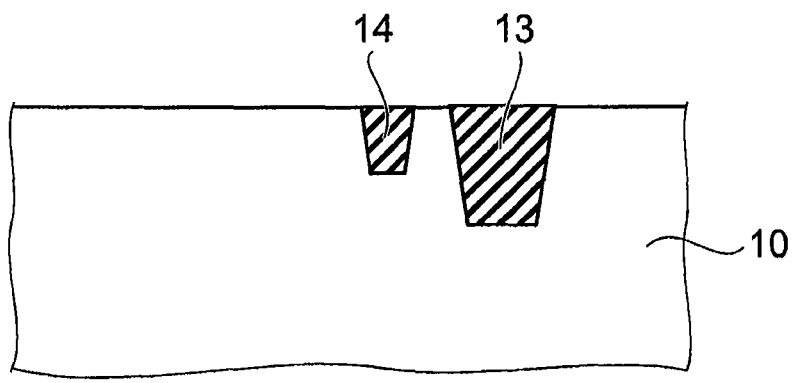

Then, after removing the resist layer 50, an insulating substance is filled into the first trench 11 and into the second trench 12. Thereby, as illustrated in FIG. 3B, the first field insulating film 13 and the second field insulating film 14 are formed with different depths on the front face side of the semiconductor layer 10.

The first trench 11 and the second trench 12 are made simultaneously; and the insulating substance also is filled simultaneously into the first trench 11 and into the second trench 12. In other words, the first field insulating film 13 and the second field insulating film 14 are made with different depths simultaneously in the same process.

Figure 3C:
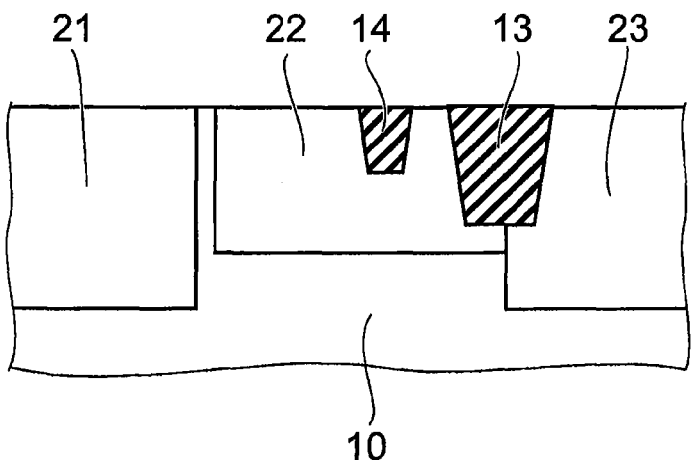

Then, as illustrated in FIG. 3C, the p-type channel region 21, the n-type drift region 22, and the n-type semiconductor region 23 are formed on the front face side of the semiconductor layer 10. These are formed by ion implantation using not-illustrated masks respectively.

The drift region 22 is formed in a region where the first field insulating film 13 and the second field insulating film 14 are formed. The channel region 21 and the n-type semiconductor region 23 are formed with the drift region 22, the second field insulating film 14, and the first field insulating film 13 interposed therebetween. The channel region 21 is formed on the second field insulating film 14 side; and the n-type semiconductor region 23 is formed on the first field insulating film 13 side.

Figure 4A:
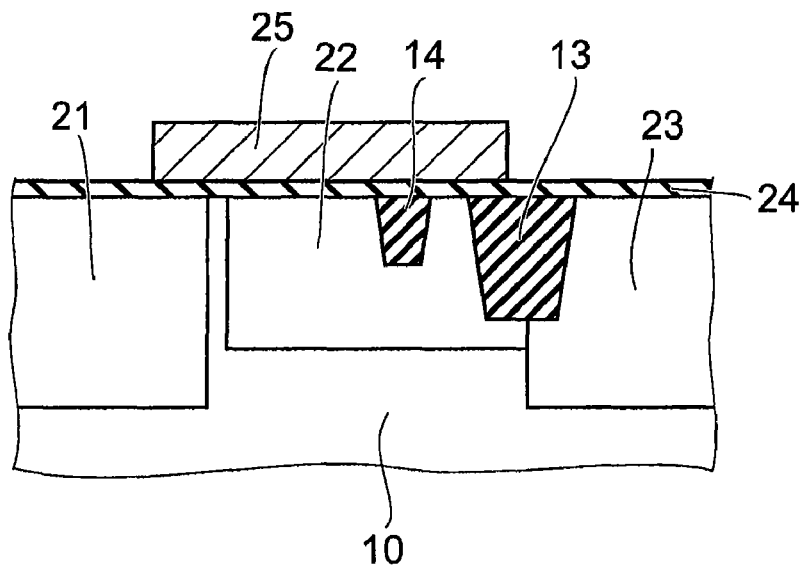

Then, the gate insulating film 24 is formed on the front face of the structure illustrated in FIG. 3C. A gate electrode material (e.g., polycrystalline silicon) is formed on the gate insulating film 24. Subsequently, the gate electrode material is patterned to form the gate electrode 25 as illustrated in FIG. 4A.

Figure 4B:
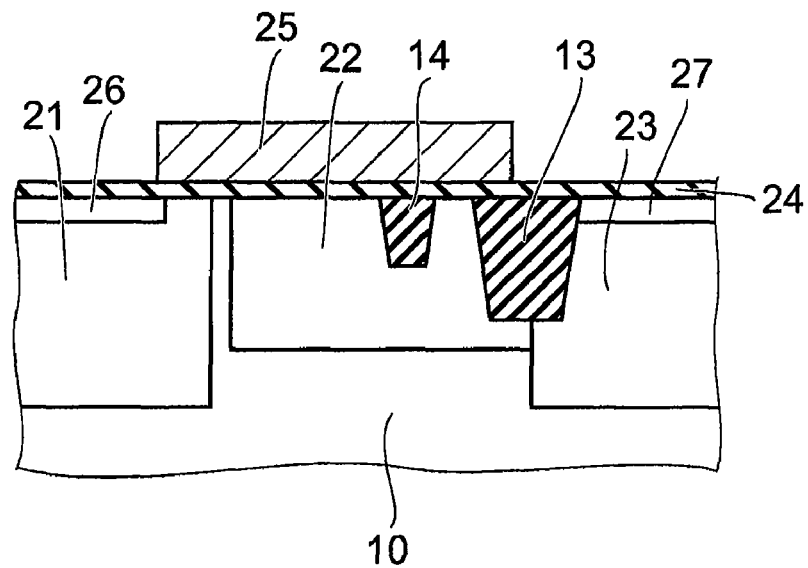

Continuing, as illustrated in FIG. 4B, the source region 26 is formed on the front face side of the channel region 21 and the drain region 27 is formed on the front face side of the n-type semiconductor region 23 by ion implantation using the gate electrode 25 as a mask.

Subsequently, as illustrated in FIG. 1, the gate insulating film 24 is selectively removed to expose the front face of the source region 26 and the front face of the drain region 27. Then, the source electrode 31 is formed on the source region 26; and the drain electrode 32 is formed on the drain region 27.

Figure 5A:
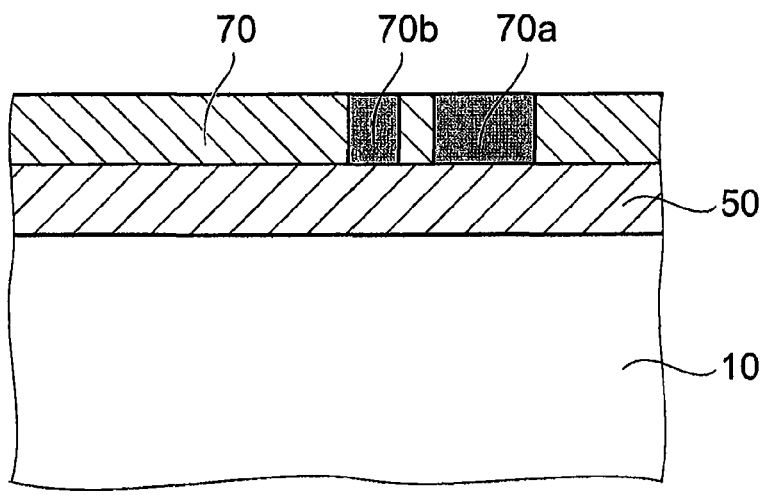
FIGS. 5A to 5C are schematic cross-sectional views illustrating another method for manufacturing the semiconductor device of the embodiment.
Figure 5B:
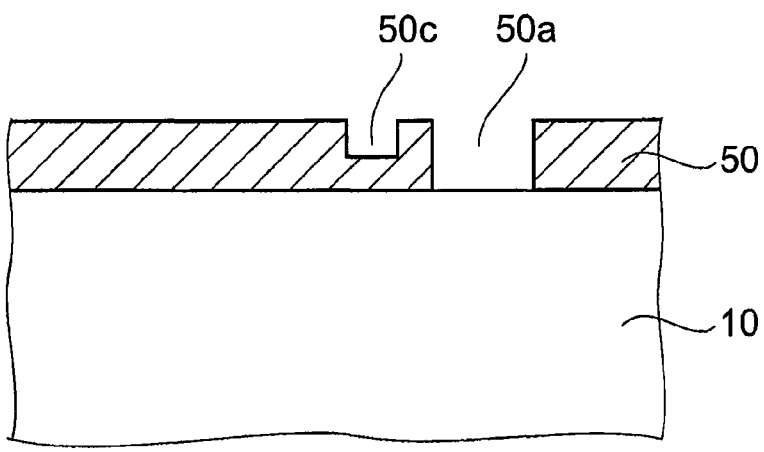
Figure 5C:
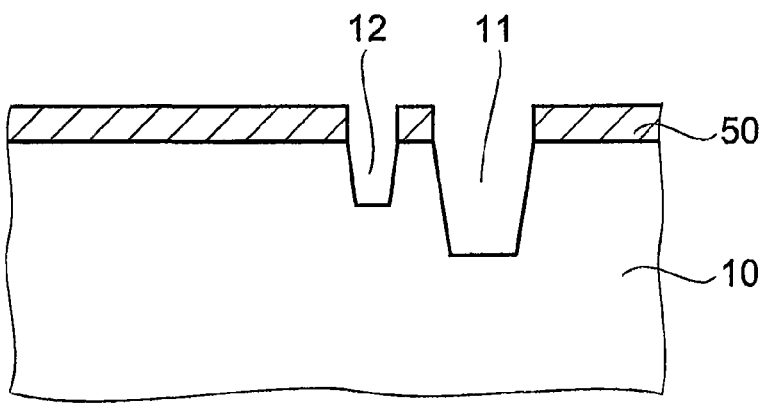
Figure 6B:
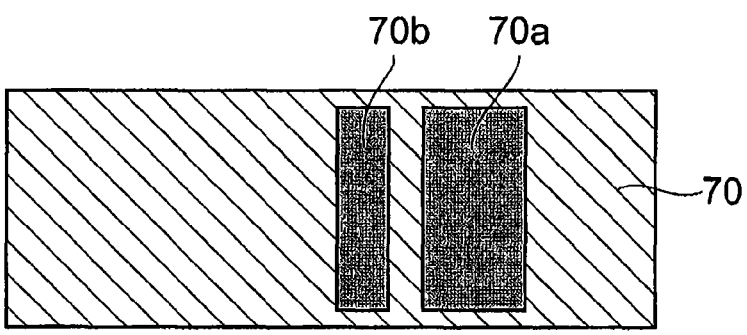

As illustrated in FIGS. 5A to 5C, the resist layer 50 may be exposed by utilizing a grating mask 70. FIG. 6B is a plan view of the grating mask 70.

A first transmitting portion 70a and a second transmitting portion 70b are formed in the grating mask 70. The second transmitting portion 70b has a lower transmittance than that of the first transmitting portion 70a with respect to the exposure light. The second transmitting portion 70b has a width smaller than the width of the first transmitting portion 70a.

The portion of the resist layer 50 under the first transmitting portion 70a and the portion of the resist layer 50 under the second transmitting portion 70b are exposed. Here, the exposure light reaches substantially the entire resist layer 50 under the first transmitting portion 70a in the film thickness direction. Conversely, the exposure light reaches only partway through the resist layer 50 under the second transmitting portion 70b in the film thickness direction.

Accordingly, by performing the development after the exposure recited above, the first opening 50a and a second opening 50c shallower than the first opening 50a are made in the resist layer 50 as illustrated in FIG. 5B. The front face of the semiconductor layer 10 is exposed at the bottom portion of the first opening 50a; and the resist layer 50 remains under the second opening 50c. Or, the resist layer 50 may remain under the first opening 50a. In such a case, the thickness of the resist layer 50 under the first opening 50a is made to be thinner than the thickness of the resist layer 50 under the second opening 50c.

Then, the front face side of the semiconductor layer 10 is etched by, for example, RIE using the resist layer 50 as a mask. Thereby, as illustrated in FIG. 5C, the first trench 11 is made under the first opening 50a; and the second trench 12 is made under the second opening 50c.

Because the second opening 50c has an opening width smaller than that of the first opening 50a, the second trench 12 has a width smaller than that of the first trench 11. Further, the second trench 12 is shallower than the first trench 11 because the resist layer 50 remains under the second opening 50c, or because the resist layer 50 under the second opening 50c is thicker.

In other words, because of the difference between the thickness (including a thickness of zero) of the resist layer 50 on the portion where the first trench 11 is made and the thickness of the resist layer 50 on the portion where the second trench 12 is made, the first trench 11 and the second trench 12 can be made simultaneously with different depths. Only one mask 70 can be used to make the two trenches 11 and 12.

After removing the resist layer 50, an insulating substance is filled into the first trench 11 and into the second trench 12. Thereby, as illustrated in FIG. 3B, the first field insulating film 13 and the second field insulating film 14 are made with different depths on the front face side of the semiconductor layer 10. Thereinafter, the processes proceed similarly to the embodiment described above.

In the embodiment as well, the first trench 11 and the second trench 12 are made simultaneously; and the insulating substance also is filled simultaneously into the first trench 11 and into the second trench 12. In other words, the first field insulating film 13 and the second field insulating film 14 are made with different depths simultaneously in the same process.

The first field insulating film 13 and the second field insulating film 14 may be made separated from each other with different depths by using separate processes.

For example, first, the first trench 11 may be made by performing the exposing and the developing of the resist layer 50 using a mask for making the first trench 11 and by performing RIE on the semiconductor layer 10. Subsequently, a first insulating substance may be filled into the first trench 11 to form the first field insulating film 13.

Subsequently, the second field insulating film 14 may be formed by making the second trench 12 which is shallower than the first trench 11 by exposing and developing the resist layer 50 using another mask, performing RIE on the semiconductor layer 10, and filling a second insulating substance into the second trench 12.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the invention.

What is claimed is:

1. A method for manufacturing a semiconductor device, comprising:
    simultaneously forming a first field insulating film and at least one second field insulating film on a front face side of a semiconductor layer, the at least one second field insulating film being separated from the first field insulating film and thinner than the first field insulating film;
    forming a drift region of a first conductivity type in a region of the semiconductor layer including the first field insulating film and the second field insulating film;
    forming a gate insulating film on a front face of the semiconductor layer;
    forming a gate electrode on the gate insulating film;
    forming a drain region of the first conductivity type in the front face of the semiconductor layer on a side of the first field insulating film, the drain region having a first conductivity type impurity concentration higher than a first conductivity type impurity concentration of the drift region; and
    forming a source region of the first conductivity type in the front face of the semiconductor layer on a side of the second field insulating film.

2. The method according to claim 1, wherein the forming the first field insulating film and the second field insulating film includes:
    simultaneously making a first trench and a second trench shallower than the first trench in the front face side of the semiconductor layer by etching the front face side of the semiconductor layer using a resist layer as a mask, the resist layer having a first opening and a second opening having a width smaller than a width of the first opening; and
    filling an insulating substance into the first trench and into the second trench.

3. The method according to claim 2, wherein the making the first opening and the second opening in the resist layer includes:
    exposing the resist layer using a mask including light-transmitting portions having different widths; and
    developing the resist layer after the exposing.

4. The method according to claim 2, wherein the first trench and the second trench are made using Reactive Ion Etching (RIE).

5. The method according to claim 1, wherein the forming of the first field insulating film and the second field insulating film includes:
    simultaneously making a first trench and a second trench shallower than the first trench in the front face side of the semiconductor layer by etching the front face side of the semiconductor layer using a resist layer as a mask, the resist layer having a first opening and a second opening having a width smaller than a width of the first opening and shallower than the first opening; and
    filling an insulating substance into the first trench and into the second trench.

6. The method according to claim 5, wherein the making the first opening and the second opening in the resist layer includes:
    exposing the resist layer using a grating mask including light-transmitting portions having different transmittances with respect to exposure light; and
    developing the resist layer after the exposing.

7. The method according to claim 5, wherein the first trench and the second trench are made using Reactive Ion Etching (RIE).

8. A semiconductor device, comprising:
    a source region of a first conductivity type;
    a drain region of the first conductivity type provided separated from the source region;
    a channel region provided between the source region and the drain region;
    a drift region of the first conductivity type provided between the channel region and the drain region, the drift region having a first conductivity type impurity concentration lower than a first conductivity type impurity concentration of the drain region;
    a gate insulating film provided on the channel region;
    a gate electrode provided on the gate insulating film;
    a first field insulating film provided in the drift region; and
    at least one second field insulating film provided in the drift region, the at least one second field insulating film being separated from the first field insulating film and provided further toward a side of the channel region than the first field insulating film, a depth of the at least one second field insulating film in the drift region being shallower than a depth of the first field insulating film in the drift region.

9. The device according to claim 8, wherein
the first field insulating film is a first insulating substance filled into a first trench made in the drift region, and
the second field insulating film is a second insulating substance filled into a second trench made in the drift region, the second trench being shallower than the first trench.

10. The device according to claim 8, wherein a thickness of the drift region under the second field insulating film is thicker than a thickness of the drift region under the first field insulating film.

11. The device according to claim 8, wherein a bottom portion of the first field insulating film is shallower than a bottom portion of the drift region, and a portion of the drift region exists under the bottom portion of the first field insulating film.

12. The device according to claim 8, wherein one side face of the first field insulating film on the side of the channel region side is in contact with the drift region, and one other side face of the first field insulating film is in contact with the drain region.

13. The device according to claim 8, further comprising a first conductivity type semiconductor region provided between the drift region and the drain region, the first conductivity type semiconductor region having a first conductivity type impurity concentration between the first conductivity type impurity concentration of the drift region and the first conductivity type impurity concentration of the drain region.

14. The device according to claim 13, wherein the drain region is provided in a front face of the first conductivity type semiconductor region.

15. The device according to claim 13, wherein a bottom portion of the first field insulating film is shallower than a bottom portion of the drift region and a bottom portion of the first conductivity type semiconductor region, and a portion of the drift region and a portion of the first conductivity type semiconductor region exist under the bottom portion of the first field insulating film.

16. The device according to claim 13, wherein one side face of the first field insulating film on the side of the channel region is in contact with the drift region, and one other side face of the first field insulating film is in contact with the drain region and the first conductivity type semiconductor region.

17. The device according to claim 8, wherein
the second field insulating film is multiply provided, and
the second field insulating film becomes thinner as the second field insulating film is provided toward the channel region.

\* \* \* \* \*